United States Patent [19]
Velmer

[11] Patent Number: 5,515,446
[45] Date of Patent: May 7, 1996

[54] ELECTRONIC AUDIO ACCURATE REPRODUCTION SYSTEM AND METHOD

[76] Inventor: George Velmer, 4241-K Colfax Ave., Studio City, Calif. 91604

[21] Appl. No.: 293,405

[22] Filed: Aug. 22, 1994

Related U.S. Application Data

[63] Continuation of Ser. No. 955,770, Oct. 2, 1992, abandoned.

[51] Int. Cl.⁶ .................................................. H03G 5/00
[52] U.S. Cl. ........................... 381/98; 381/106; 333/14
[58] Field of Search .................................. 381/106, 114, 381/120, 103, 61, 28; 333/14

[56] References Cited

U.S. PATENT DOCUMENTS

| | | | |
|---|---|---|---|
| 3,101,391 | 8/1963 | Tomatis | 381/61 |
| 3,617,920 | 11/1971 | Jarvis | 381/103 |
| 4,186,273 | 1/1980 | Dodson | 381/28 |
| 4,280,018 | 7/1981 | Lazarus et al. | 381/114 |
| 4,567,608 | 1/1986 | Watson et al. | 381/120 |
| 4,701,953 | 10/1987 | White | 381/106 |

OTHER PUBLICATIONS

National Semiconductor, AN-30, Nov. 1969.
Tremaine, Audio Cyclopedia, 1980, pp. 931–939.

Primary Examiner—Forester W. Isen

[57] ABSTRACT

An electronic audio processing system for insertion into the line prior to power amplification and a related method are disclosed which component and method render a frequency response in which undesirably strong frequency bands are flattened relative to the total frequency response by up to 10 dB, thereby providing enhanced dynamic audio reproduction. The audio signal is split into a plurality of frequency bands, each of which is actively, dynamically limited to a predetermined level related to the overall level of the unprocessed signal. The frequency bands are then recombined into a single processed signal which has an overall response which is as much as 10 dB more linearity than the unprocessed signal.

22 Claims, 4 Drawing Sheets

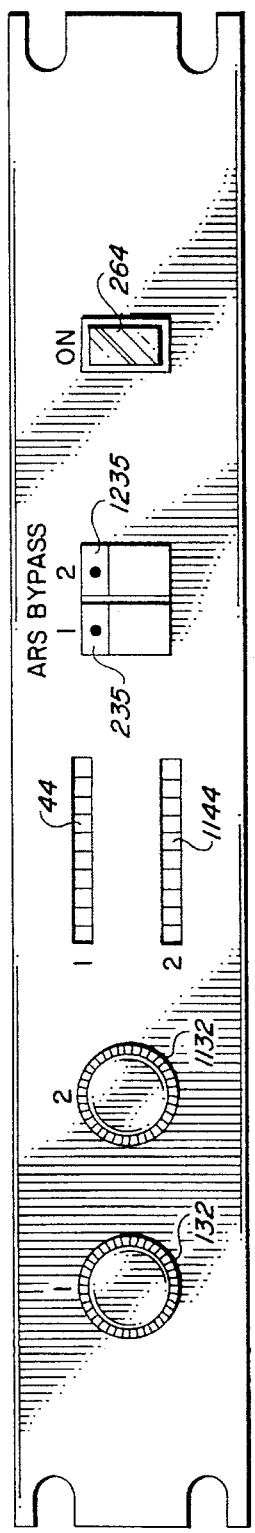
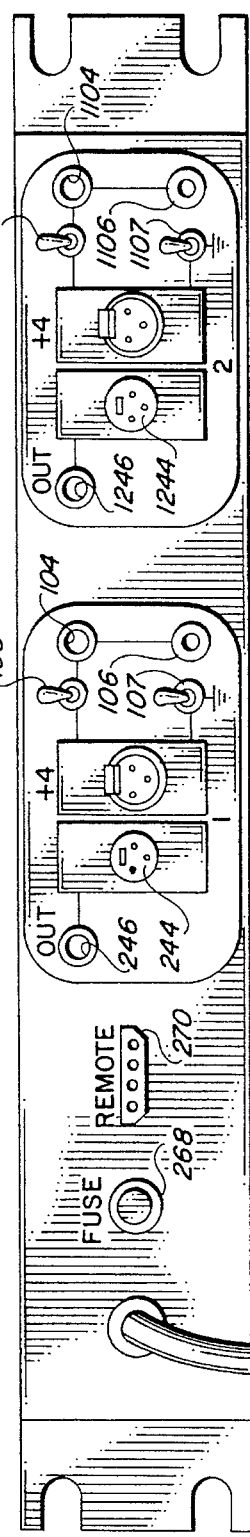
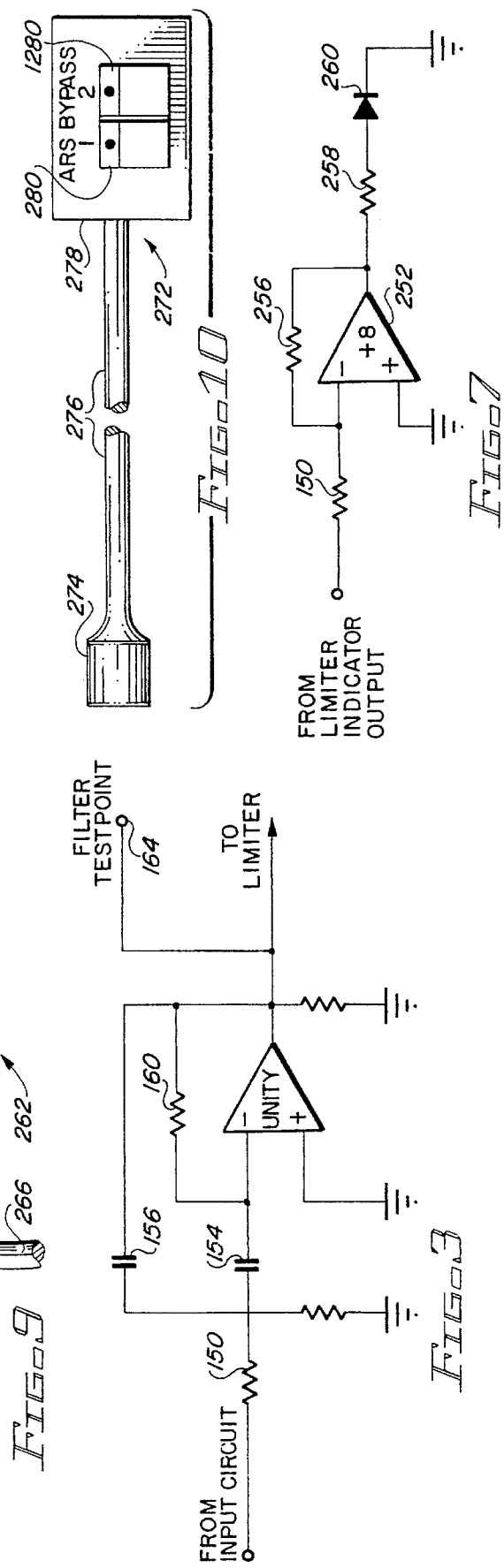

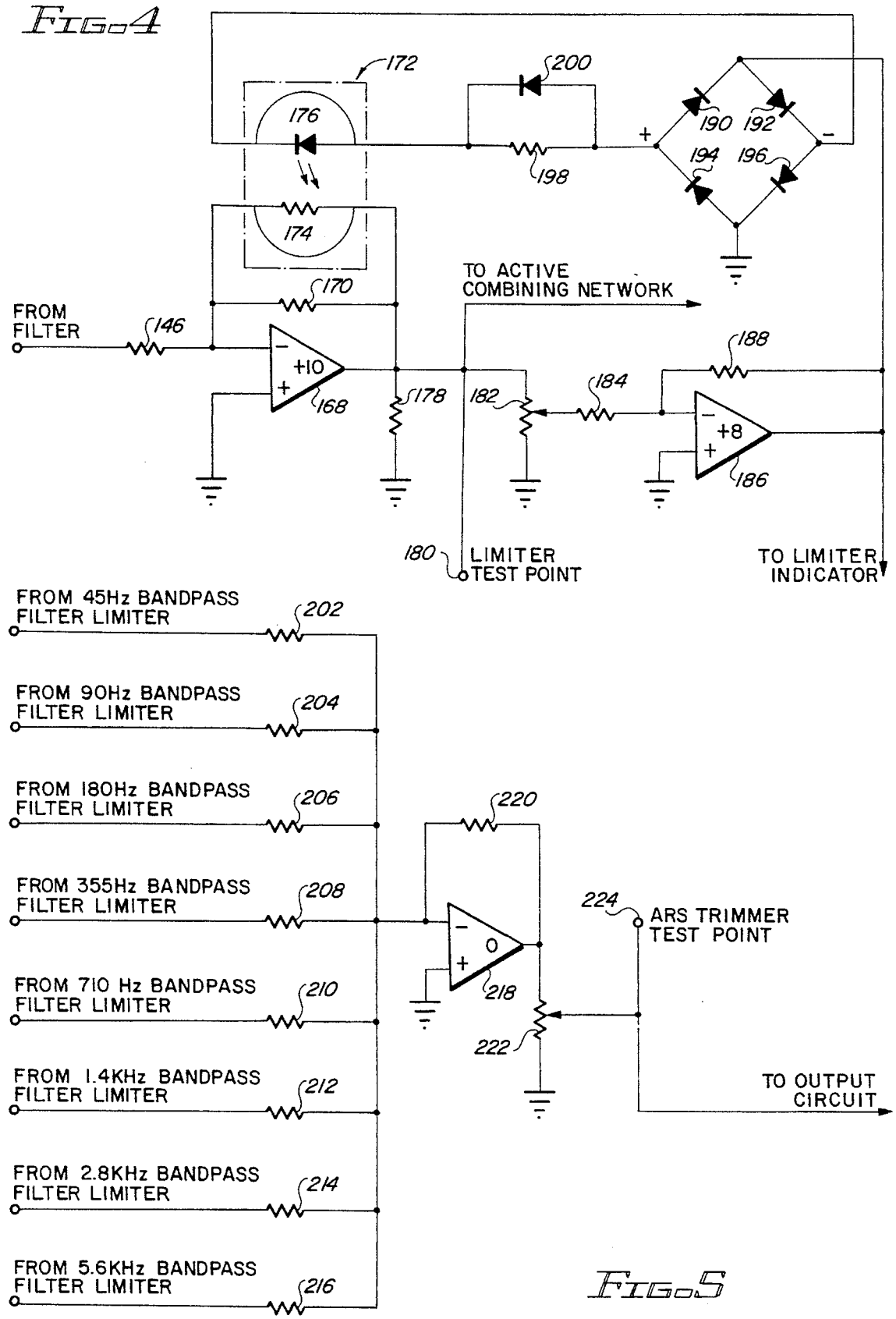

5,515,446

ELECTRONIC AUDIO ACCURATE REPRODUCTION SYSTEM AND METHOD

This is a continuation of application Ser. No. 07/955,770, filed on Oct. 2, 1992, now abandoned.

BACKGROUND OF THE INVENTION

Field of the Invention

The present invention relates generally to an electronic audio processing system and method, and more particularly to a component for insertion into the line prior to power amplification and a related method which component and method render a frequency response in which undesirably strong frequency bands are flattened relative to the total frequency response by up to 10 dB, thereby providing enhanced dynamic audio reproduction.

Electronic audio reproduction systems include as a minimum an audio signal source, an amplifier (typically including a preamplifier and a power amplifier), and speakers or headphones. The sound of even basic systems usually has at least bass and treble adjustments to vary the tone of the reproduced audio. The art has provided more variety to these basic controls of tone over time, with the enhanced controls manifesting themselves in two completely different techniques.

The first technique is merely an enhancement of the simple bass and treble controls. This approach is embodied in the graphic equalizer, which provides between five and twenty-seven (or more) frequency band adjustments to the audio signal. A twenty-seven band equalizer is a ⅓ octave device, and ⅙ octave equalizers do exist which would have more than twenty-seven frequency bands.

An equalizer splits the audio signal into different frequencies, each of which can be individually attenuated or boosted. Such equalizers are thus completely static in their adjustments, since the attenuation and boost settings of the various frequency bands are manually set at desired levels, and remain there until they are manually reset.

The second technique is that of dynamic amplitude expansion, in which low level or soft sounds (of all frequencies) are slightly boosted, high level or loud sounds are slightly attenuated, and mid level or average sounds are neither attenuated nor boosted. Such dynamic amplitude expansion thus provides a greater variation of amplitude, which may be desirable when listening to music where the overall variation in amplitude has been reduced in the recording process to ensure better reproduction. Typically, very low levels are boosted in the recording process to provide a better signal-to-noise level.

However, neither of these two techniques are capable of providing a truly dynamic reproduction of audio due to limitations inherent in their design. The first technique is static rather than dynamic, and thus as the signal changes, the equalizer is completely nonresponsive. This can require frequent adjustments, particularly as the source or the type of music is varied. The second technique is completely ineffective at varying the relative response of different frequency bands, and thus is not of interest herein.

The problem which these prior art devices and techniques do not address is that different audio sources and types of music have different frequency problems therein. For example, while CD's and digitally recorded music are apt to be nearly completely flat in overall response (subject to proper microphone placement and sound recording), overall frequency response of music from tapes and records and music recorded with poor microphone placement or poor recording equipment is anything but flat. Even more unfortunately, the non-flat frequency response is apt to be unpredictable and to vary widely with different sources and types of music, or even with different recordings of the same type of music from the same source.

It is accordingly the primary objective of the present invention that it provide an accurate reproduction system and a related methodology for operating the system to compensate for the wide variations in frequency response in any audio signal in recorded or live music. It is a further objective that the system of the present invention and the methodology for operating the system of the present invention also provide such compensation on a dynamic basis, automatically correcting frequency response irregularities as the audio signal is being reproduced. As such, the system of the present invention and the methodology for operating the system of the present invention must provide accurate dynamic compensation without the necessity for the user making frequent or complicated adjustments.

It is a further objective of the accurate reproduction system of the present invention and the related methodology for operating the system of the present invention that they provide for some degree of adjustment to compensate for sources which have a greater or lesser inaccuracy in their frequency response. This adjustment to compensate for variations in the frequency response must be easy for the user to accomplish. In addition, manual adjustment of the degree of correction to flatten overall frequency response should be facilitated by providing an indicator of the degree of adjustment made by the user which is visible as the adjustment is being made.

The accurate reproduction system of the present invention must also be of a design which is both durable and long lasting, and it should also require little or no calibration or other maintenance to be provided by the user. In order to enhance the market appeal of the accurate reproduction system of the present invention, it should also be of inexpensive construction to thereby afford it the broadest possible market. Finally, it is also an objective that all of the aforesaid advantages and objectives of the accurate reproduction system of the present invention and the related methodology for operating the system of the present invention be achieved without incurring any substantial relative disadvantage.

SUMMARY OF THE INVENTION

The disadvantages and limitations of the background art discussed above are overcome by the present invention. With this invention, an accurate reproduction system and a related methodology are taught in which dynamically varying variations in different frequency bands are automatically made to provide an overall enhancement of the flatness of the frequency response. A device embodying the system of the present invention and practicing the methodology of the present invention may be installed between the preamplification and power amplification stages of an audio system.

The device divides the incoming signal into a plurality of frequency bands, processes each band individually in accordance with the teachings of the present invention, and then recombines the bands into a single audio signal which is provided as the output of the device. In principle, the device has an overall unity gain, and thus neither amplifies or attenuates the audio signal from an amplitude aspect. The exception to this is that an audio signal ranging from −20 dB to +4 dB is either boosted or attenuated to the desired −10 dB (to 0 dB) recommended for the circuitry of the device to function.

Thus, the device first takes a full frequency range input signal and attenuates or boosts the full frequency range input signal to a −10 dB level. This attenuation or boosting may be monitored by using an indicator LED bar graph on the device. This bar graph is also used to indicate the output level.

The −10 dB full frequency range input signal is then split into a plurality of frequency bands, ranging from five to twenty-seven or more (eight in the preferred embodiment described below). Each of the individual frequency bands is supplied to a limiter having 10 dB of amplification. Each of the limiters will attempt to limit their output to a 0 dB level by providing only a 1 dB increase for each 10 dB of additional input signal. This 10:1 ratio is applicable up to a +10 dB output from the limiter. Thus, the system operates to attempt to prevent the level of any of the frequency bands from being significantly greater than 0 dB at the output of that frequency band's respective limiter.

The outputs of all of the limiters are then recombined into a single recombined signal in a unity gain active combining network. The output of the active combining network is attenuated to a −10 dB level, which attenuated signal is supplied as a single combined output signal. The device is initially calibrated with a 20 Hz to 20K Hz pink noise generator to ensure that all of the limiters are calibrated properly. The pink noise generator is also used for other aspects of calibration, as will become evident below.

A single user control is provided for each audio channel. This control is an input attenuator used to vary the level of the full frequency range input signal in the device from a −10 dB level to a 0 dB level prior to the full frequency range input signal being split into the plurality of frequency bands. Thus, each of the limiters are capable of providing at least a 10 dB increase in the range of the overall flatness of the frequency response of the audio signal.

It may therefore be seen that the present invention teaches an accurate reproduction system and a related methodology for operating the system which compensate for the wide variations in frequency response in any audio signal in recorded or live music. The system of the present invention and the methodology for operating the system of the present invention also provide such compensation on a dynamic basis, automatically correcting frequency response irregularities as the audio signal is being reproduced. As such, the system of the present invention and the methodology for operating the system of the present invention provide accurate dynamic compensation without the necessity for the user making frequent or complicated adjustments.

Further, the accurate reproduction system of the present invention and the related methodology for operating the system of the present invention provide for a significant degree of adjustment to compensate for sources which have a greater or lesser inaccuracy in their frequency response. This adjustment to compensate for variations in the frequency response is quite easy for the user to accomplish. In addition, manual adjustment of the degree of correction to flatten overall frequency response is facilitated by providing an indicator of the degree of adjustment made by the user which is visible as the adjustment is being made.

The accurate reproduction system of the present invention is also of a design which is both durable and long lasting, and it requires little or no calibration or other maintenance to be provided by the user. The accurate reproduction system of the present invention is also of inexpensive construction in order to enhance its market appeal, and to thereby afford it the broadest possible market. Finally, all of the aforesaid advantages and objectives of the accurate reproduction system of the present invention and the related methodology for operating the system of the present invention are achieved without incurring any substantial relative disadvantage.

DESCRIPTION OF THE DRAWINGS

These and other advantages of the present invention are best understood with reference to the drawings, in which:

FIG. 3 is a generic electrical schematic of the filters illustrated in FIG. 1;

FIG. 4 is a generic electrical schematic of the limiters illustrated in FIG. 1;

FIG. 5 is an electrical schematic of the active combining network illustrated in FIG. 1;

FIG. 7 is a generic electrical schematic of the limiter indicators illustrated in FIG. 1;

FIG. 8 is a front panel view of a device embodying the accurate reproduction system illustrated in FIGS. 1 through 7, showing the input attenuators, the input bar graphs, the bypass switches, and the on/off power switch;

FIG. 9 is a rear panel view of the device illustrated in FIG. 8, showing the power cord, the fuse, the −10 dB unbalanced ¼ inch phone plug and RCA plug inputs, the +4 dB balanced XLR inputs, the ¼ inch phone and the XLR outputs balanced or unbalanced, the switch used to select inputs, the switch used to lift the ground terminal on the XLR input, and a bypass remote control socket; and FIG. 10 is a plan view of a bypass remote control having a plug for connection to the bypass remote control socket shown in FIG. 9.

DETAILED DESCRIPTION OF THE PREFERRED EMBODIMENT

Figure 1:
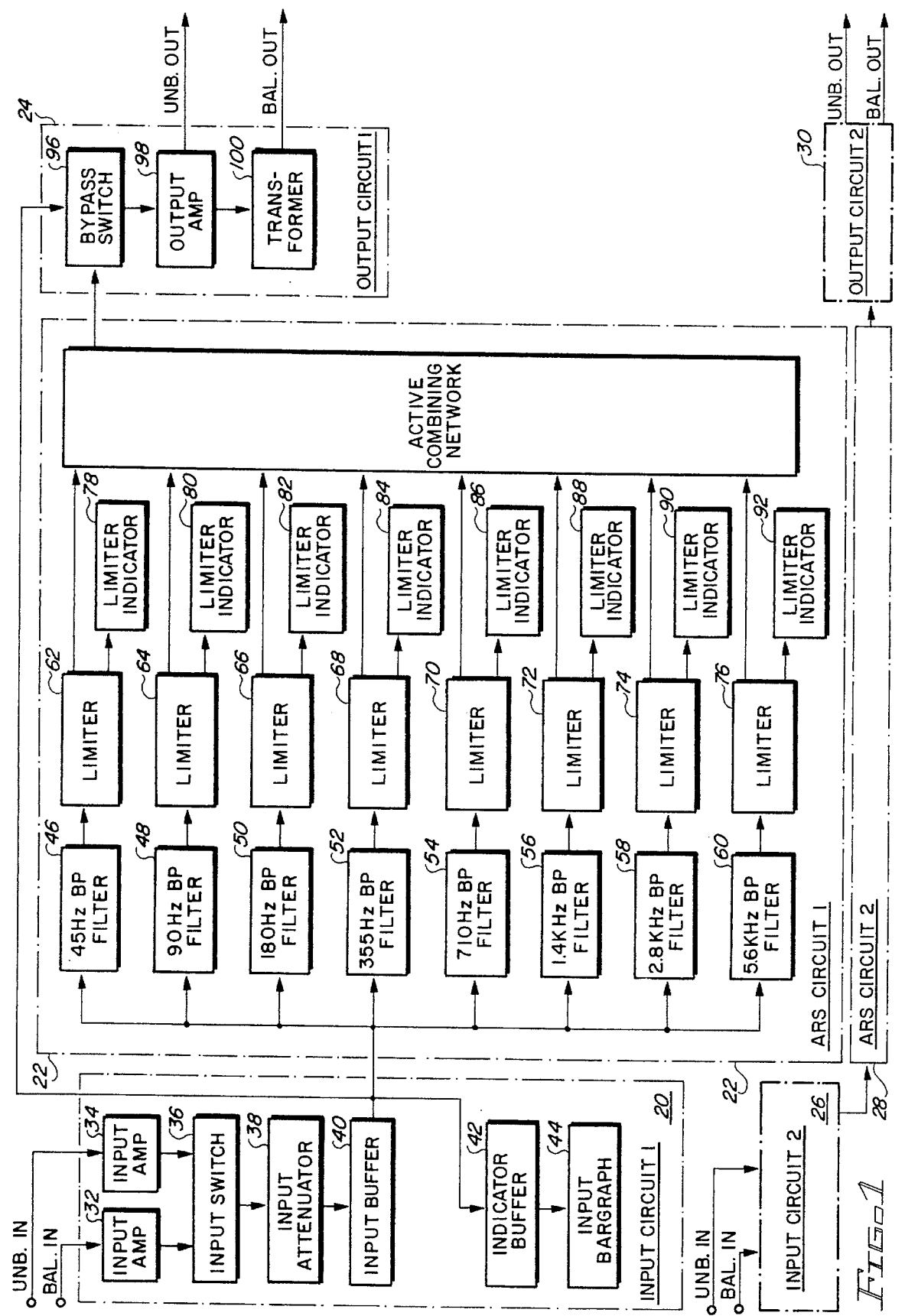
FIG. 1 is a functional schematic block diagram of the accurate reproduction system of the present invention, with the first channel shown in great functional detail and the identical second channel shown only in major component detail.

The preferred embodiment illustrated herein by way of example is a device which both embodies the system of the present invention and practices the methodology of the present invention. Referring first to FIG. 1, an overview of the accurate reproduction system of the present invention is illustrated. In the system illustrated in FIG. 1, only the components used by the first channel are shown in great functional detail. The components of the second channel are shown in less detail, but are identical to those of the first channel.

Each of the first and second channels have three major components. The components of the first channel are a first channel input circuit 20, a first channel accurate reproduction system circuit 22, and a first channel output circuit 24. The components of the second channel are a second channel input circuit 26, a second channel accurate reproduction system circuit 28, and a second channel output circuit 30.

A first channel line-level input, either balanced or unbalanced, is supplied to the first channel input circuit 20. Similarly, a second channel line-level input, either balanced or unbalanced, is supplied to the second channel input circuit 26. The first channel input circuit 20 supplies an output to each of the first channel accurate reproduction system circuit 22 and the first channel output circuit 24. Similarly, the second channel input circuit 26 supplies an output to each of the second channel accurate reproduction system circuit 28 and the second channel output circuit 30.

The first channel accurate reproduction system circuit 22 supplies an output to the first channel output circuit 24. Similarly, the second channel accurate reproduction system circuit 28 supplies an output to the second channel output circuit 30. The first channel output circuit 24 supplies a first channel line-level output, which may be set up to be either balanced or unbalanced, as will become more apparent below. Similarly, the second channel output circuit 30 supplies a second channel line-level output, which may be set up to be either balanced or unbalanced.

Referring now only to the first channel components shown in FIG. 1, a line-level signal is supplied to the first channel input circuit 20. If the line-level signal is an unbalanced signal (typically a −10 dB signal), it is supplied as an input to an input amplifier 32. If the line-level signal is a balanced signal (typically a +4 dB signal), it is supplied as an input to an input amplifier 34. The outputs from both the input amplifier 32 and the input amplifier 34 are supplied to an input switch 36, which selects the desired input and supplies it as an output to an input attenuator 38.

The input attenuator 38 supplies an output to an input buffer 40. The input buffer 40 supplies an output to three places: to an indicator buffer 42, to components in the first channel accurate reproduction system circuit 22, and to a component in the first channel output circuit 24. The indicator buffer 42 provides an output to an input bar graph 44.

The output from the input buffer 40 in the first channel input circuit 20 is supplied to eight filters in the first channel accurate reproduction system circuit 22. Note that while the system illustrated herein splits the signal into eight frequency bands, more or fewer frequency bands could be used. Seven of the filters are bandpass filters, while the eighth filter is a high pass filter. The output from the input buffer 40 in the first channel input circuit 20 is thus supplied to a 45 Hz bandpass filter 46, a 90 Hz bandpass filter 48, a 180 Hz bandpass filter 50, a 355 Hz bandpass filter 52, a 710 Hz bandpass filter 54, a 1.4K Hz bandpass filter 56, a 2.8K Hz bandpass filter 58, and a 5.6K Hz high pass filter 60. The high pass filter 60 is used to carry the frequency response from 5.6K Hz to 20K Hz.

The outputs from the filters 46, 48, 50, 52, 54, 56, 58, and 60 are each supplied to one of eight limiters. Thus, the output from the 45 Hz bandpass filter 46 is supplied to a limiter 62, the output from the 90 Hz bandpass filter 48 is supplied to a limiter 64, the output from the 180 Hz bandpass filter 50 is supplied to a limiter 66, and the output from the 355 Hz bandpass filter 52 is supplied to a limiter 68. Similarly, the output from the 710 Hz bandpass filter 54 is supplied to a limiter 70, the output from the 1.4K Hz bandpass filter 56 is supplied to a limiter 72, the output from the 2.8K Hz bandpass filter 58 is supplied to a limiter 74, and the output from the 5.6K Hz high pass filter 60 is supplied to a limiter 76.

A calibrating output from each of the limiters 62, 64, 66, 68, 70, 72, 74, and 76 is supplied to one of eight limiter indicators, which are not technically used in the first channel accurate reproduction system circuit 22, but are shown there in FIG. 1 since they may be used to calibrate the limiters 62, 64, 66, 68, 70, 72, 74, and 76. The primary function of the limit indicators, of course, is to visually indicate limiting in process. Thus, the calibrating output from the limiter 62 is supplied to a limiter indicator 78, the calibrating output from the limiter 64 is supplied to a limiter indicator 80, the calibrating output from the limiter 66 is supplied to a limiter indicator 82, and the calibrating output from the limiter 68 is supplied to a limiter indicator 84. Similarly, the calibrating output from the limiter 70 is supplied to a limiter indicator 86, the calibrating output from the limiter 72 is supplied to a limiter indicator 88, the calibrating output from the limiter 74 is supplied to a limiter indicator 90, and the calibrating output from the limiter 76 is supplied to a limiter indicator 92.

The signal outputs of the limiters 62, 64, 66, 68, 70, 72, 74, and 76 are supplied to an active combining network 94, which recombines the outputs of all of the limiters 62, 64, 66, 68, 70, 72, 74, and 76 into a single recombined signal. This recombined signal is supplied to a bypass switch 96 in the first channel output circuit 24. Note that the output of the input buffer 40 in the first channel input circuit 20 is also supplied to the bypass switch 96 in the first channel output circuit 24. The bypass switch 96 is used to either select the signal processed by the first channel accurate reproduction system circuit 22, or to bypass the first channel accurate reproduction system circuit 22 and select the unprocessed signal from the input buffer 40 of the first channel input circuit 20.

The output of the bypass switch 96 is supplied to an output amplifier 98. The output of the output amplifier 98 is supplied from the accurate reproduction system as either an unbalanced line-level signal (typically a −10 dB signal), or as a balanced signal. If a balanced output is desired, the output of the output amplifier 98 is supplied as an input to an optional transformer 100. The output from the optional transformer 100 is supplied from the accurate reproduction system as the balanced signal (typically a +4 dB signal).

Figure 2:
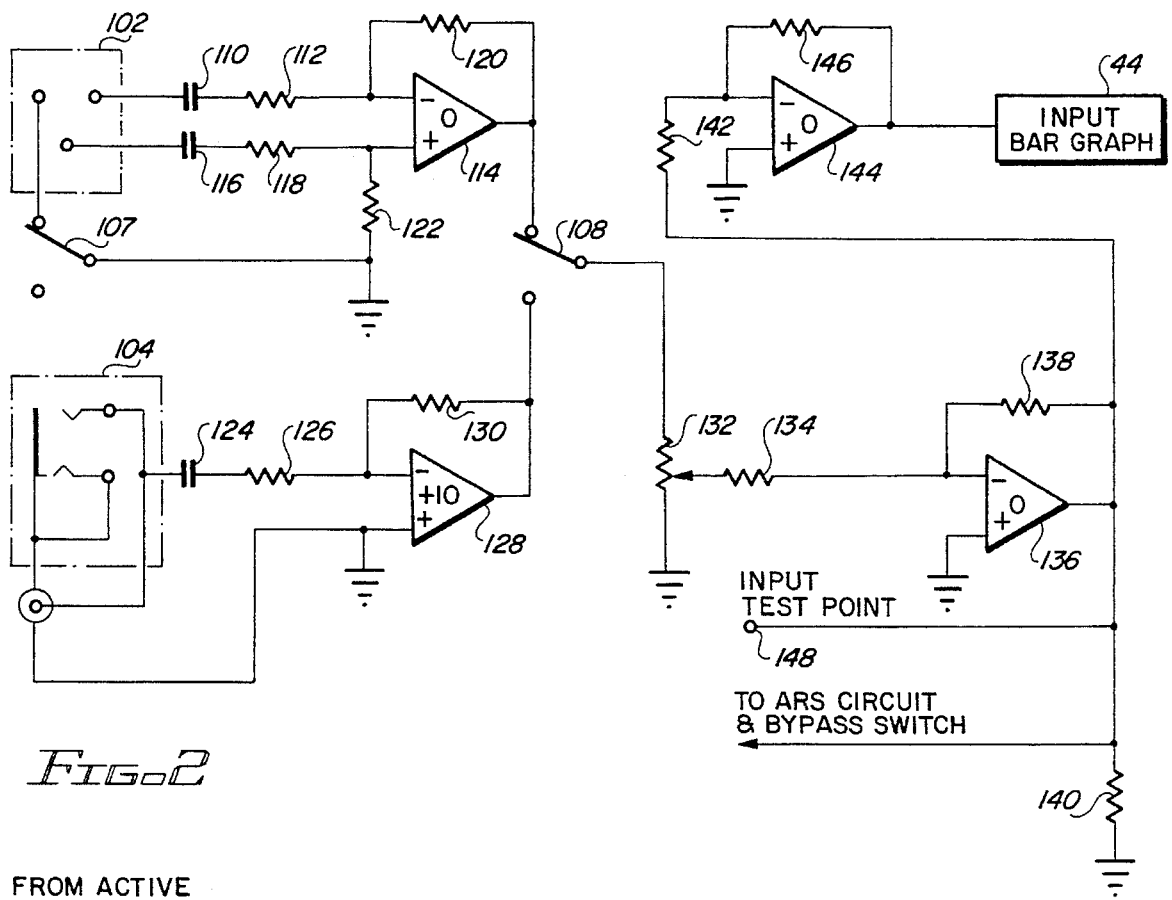
FIG. 2 is an electrical schematic of the first channel input circuit illustrated in FIG. 1, showing the input amplifiers, the input switch, the input attenuator, the input buffer, the indicator buffer, and the input bar graph (the last of which is an off-the-shelf component shown only as a block)

Referring next to FIG. 2, an electrical schematic of the first channel input circuit 20 of FIG. 1 is illustrated. Three input connectors are provided in the preferred embodiment: a female XLR connector 102, a female ¼ inch phone plug 104, and a female RCA plug 106. In conjunction with the female XLR connector 102, there is a single pole, double throw ground lift switch 107 and a single pole, double throw input selector switch 108 used, which each have the first positions shown in FIG. 2 when a male XLR connector (not shown) is plugged into the female XLR connector 102 as a balanced input. The ground lift switch 107 is used to prevent buzz, hum, and other noise due to interfacing the output of other equipment with the input of the device of the present invention. Only the XLR connector ground is lifted. The input selector switch 108 is used to select between a balanced input and an unbalanced input from their respective amplifiers.

A first one of the terminals of the female XLR connector 102 is connected to a first side of a capacitor 110. The second side of the capacitor 110 is connected to a first side of a resistor 112. The second side of the resistor 112 is connected to the inverting input of an operational amplifier 114. A second one of the terminals of the female XLR connector 102 is connected to a first side of a capacitor 116. The second side of the capacitor 116 is connected to a first side of a resistor 118. The second side of the resistor 118 is connected to the non-inverting input of the operational amplifier 114. A third one of the terminals of the female XLR connector 102 is connected to the first contact of the ground lift switch 107.

The first side of a resistor 120 is connected to the inverting input of the operational amplifier 114. The second side of the resistor 120 is connected to the output of the operational amplifier 114. The first side of a resistor 122 is connected to the non-inverting input of the operational amplifier 114. The second side of the resistor 122 is connected to ground, and to the throw of the ground lift switch 107. The second contact of the ground lift switch 107 is unconnected. The output of the operational amplifier 114 is connected to the first contact of the input selector switch 108.

The capacitors 110 and 116, the resistors 112, 118, 120, and 122, and the operational amplifier 114 together constitute the input amplifier 34 (FIG. 1). In the preferred embodiment, the capacitors 110 and 116 each have a value of 1.0 microfarad, and the resistors 112, 118, 120, and 122 each have a value of 25K Ohms. The balanced input of the accurate reproduction system thus has an impedance of 50K Ohms. The input amplifier 34 has a gain of 0 dB, or a unity gain.

The tip terminal of the female ¼ inch phone plug 104 is connected to the first side of a capacitor 124, and to the center terminal of the female RCA plug 106. The second side of the capacitor 124 is connected to the first side of a resistor 126. The second side of the resistor 126 is connected to the inverting input of an operational amplifier 128. One side of a resistor 130 is connected to the inverting input of the operational amplifier 128. The second side of the resistor 130 is connected to the output of the operational amplifier 128. The non-inverting input of the operational amplifier 128 is connected to ground.

The intermediate terminal of the female ¼ inch phone plug 104 is connected to the sleeve terminal of the female ¼ inch phone plug 104, to the outer terminal of the female RCA plug 106, and to the non-inverting input of the operational amplifier 128, which is-grounded. The output of the operational amplifier 128 is connected to the second contact of the input selector switch 108.

The capacitor 124, the resistors 126 and 130, and the operational amplifier 128 together constitute the input amplifier 32 (FIG. 1). In the preferred embodiment, the capacitor 110 has a value of 1.0 microfarad, the resistor 126 has a value of 50K Ohms, and the resistor 130 has a value of 165K Ohms. The unbalanced input of the accurate reproduction system thus also has an impedance of 50K Ohms. The input amplifier 32 has a gain of +10 dB.

The throw of the input selector switch 108 is connected to the first side of a potentiometer 132. The input selector switch 108 constitutes the input switch 36 (FIG. 1). The second side of the potentiometer 132 is connected to ground. The center tap of the potentiometer 132 is connected to the first side of a resistor 134. The potentiometer 132 constitutes the input attenuator 38 (FIG. 1). In the preferred embodiment, the potentiometer 132 is 10K Ohms.

The second side of the resistor 134 is connected to the inverting input of an operational amplifier 136. The non-inverting input of the operational amplifier 136 is connected to ground. The first side of a resistor 138 is connected to the inverting input of the operational amplifier 136. The second side of the resistor 138 is connected to the output of the operational amplifier 136. The first side of a resistor 140 is connected to the output of the operational amplifier 136. The second side of the resistor 140 is connected to ground.

The resistors 134, 138, and 140 and the operational amplifier 136 together constitute the input buffer 40 (FIG. 1). In the preferred embodiment, the resistor 134 has a value of 10K Ohms, the resistor 138 has a value of 10K Ohms, and the resistor 140 has a value of 620 Ohms. The input buffer 40 has a gain of 0 dB, or a unity gain.

The output of the operational amplifier 136 is connected to the first side of a resistor 142. The second side of the resistor 142 is connected to the inverting input of an operational amplifier 144. The non-inverting input of the operational amplifier 144 is connected to ground. The first side of a resistor 146 is connected to the inverting input of the operational amplifier 144. The second side of the resistor 146 is connected to the output of the operational amplifier 144.

The resistors 142 and 146 and the operational amplifier 144 together constitute the indicator buffer 42 (FIG. 1). In the preferred embodiment, the resistors 142 and 146 each have a value of 100K Ohms. The indicator buffer 42 has a gain of 0 dB, or a unity gain. The output of the operational amplifier 144 is connected to the input bar graph 44 (also shown in FIG. 1). In the preferred embodiment, the input bar graph 44 is a National LM 3916 dot flash bar display driver, and constitutes a volume units (VU) display.

The output of the operational amplifier 136 is connected to an input test point 148. The output of the operational amplifier 136 is also the output of the first channel input circuit 20 (FIG. 1), which is supplied as inputs to the filters 46, 48, 50, 52, 54, 56, 58, and 60 in the first channel accurate reproduction system circuit 22 (FIG. 1), and as an input to the bypass switch 96 in the first channel output circuit 24 (FIG. 1).

Referring now to FIG. 3, a generic electrical schematic of the filters 46, 48, 50, 52, 54, 56, 58, and 60 used in the first channel accurate reproduction system circuit 22 of FIG. 1 is illustrated. Each of the filters 46, 48, 50, 52, 54, 56, 58, and 60 uses this same schematic, with only the values of certain components used in the filters 46, 48, 50, 52, 54, 56, 58, and 60 being different. For each of the filters 46, 48, 50, 52, 54, 56, 58, and 60, the first side of a resistor 150 is connected to the output of the operational amplifier 136 of the first channel input circuit 20 illustrated in FIG. 2.

The second side of the resistor 150 is connected to the first side of a resistor 152, to the first side of a capacitor 154, and to the first side of a capacitor 156. The second side of the resistor 152 is connected to ground. The second side of the capacitor 154 is connected to the inverting input of an operational amplifier 158. The second side of the capacitor 156 is connected to the output of the operational amplifier 158. The non-inverting input of the operational amplifier 158 is connected to ground. The first side of a resistor 160 is connected to the inverting input of the operational amplifier 158. The second side of the resistor 160 is connected to the output of the operational amplifier 158. The first side of a resistor 162 is connected to the output of the operational amplifier 158. The second side of the resistor 162 is connected to ground.

The resistors 150, 152, 160, and 162, the capacitors 154 and 156, and the Operational amplifier 158 together constitute a filter. In the preferred embodiment, the resistors 150 and 152 each have a value of 39K Ohms, the resistor 160 has a value of 312K Ohms (which may be made of a 300K Ohm resistor and a 12K Ohm resistor in series), and the resistor 162 has a value of 620 Ohms. In the 5.6K Hz high pass filter 60, the capacitor 154 has a value of 0.0022 microfarads and the capacitor 156 has a value of 47 picofarads.

In each of the bandpass filters 46, 48, 50, 52, 54, 56, and 58, the capacitor 154 and the capacitor 156 each have the same value. That value is 0.047 microfarads for the 45 Hz bandpass filter 46, 0.022 microfarads for the 90 Hz bandpass filter 48, 0.011 microfarads for the 180 Hz bandpass filter 50, 0.0056 microfarads for the 355 Hz bandpass filter 52, 0.0028 microfarads for the 710 Hz bandpass filter 54, 0.0015 microfarads for the 1.4K Hz bandpass filter 56, and 721 picofarads for the 2.8K Hz bandpass filter 58.

The filters 46, 48, 50, 52, 54, 56, 58, and 60 each have a gain of essentially 0 dB, or a unity gain. The operational amplifier 158 makes up for the loss incurred in the filter components. In actuality, the level of the filter output is slightly more than the level of the filter input, but less than 1 dB more. The output of the operational amplifier 158 of each of the filters 46, 48, 50, 52, 54, 56, 58, and 60 is connected to a filter test point 164. The output of the operational amplifier 158 is also the output of each of the filters 46, 48, 50, 52, 54, 56, 58, and 60. This output is supplied as an input to the appropriate limiter in the first channel accurate reproduction system circuit 22 (FIG. 1).

Referring next to FIG. 4, a generic electrical schematic of the limiters 62, 64, 66, 68, 70, 72, 74, and 76 used in the first channel accurate reproduction system circuit 22 of FIG. 1 is illustrated. Each of the limiters 62, 64, 66, 68, 70, 72, 74, and 76 uses this same schematic, with identical component values being used in the limiters 62, 64, 66, 68, 70, 72, 74, and 76. The first side of a resistor 166 is connected to the output of the operational amplifier 158 of the filters 46, 48, 50, 52, 54, 56, 58, and 60 illustrated in FIG. 3.

Thus, the resistor 166 in the limiter 62 is connected to the output of the operational amplifier 158 in the 45 Hz bandpass filter 46, the resistor 166 in the limiter 64 is connected to the output of the operational amplifier 158 in the 90 Hz bandpass filter 48, the resistor 166 in the limiter 66 is connected to the output of the operational amplifier 158 in the 180 Hz bandpass filter 50, and the resistor 166 in the limiter 68 is connected to the output of the operational amplifier 158 in the 355 Hz bandpass filter 52.

Similarly, the resistor 166 in the limiter 70 is connected to the output of the operational amplifier 158 in the 710 Hz bandpass filter 54, the resistor 166 in the limiter 72 is connected to the output of the operational amplifier 158 in the 1.4K Hz bandpass filter 56, the resistor 166 in the limiter 74 is connected to the output of the operational amplifier 158 in the 2.8K Hz bandpass filter 58, and the resistor 166 in the limiter 76 is connected to the output of the operational amplifier 158 in the 5.6K Hz high pass filter 60.

The other side of the resistor 166 is connected to the inverting input of an operational amplifier 168. The first side of a resistor 170 is connected to the inverting input of the operational amplifier 168. The second side of the resistor 170 is connected to the output of the operational amplifier 168. A photoconductive module 172 having a light-dependent resistor 174 controlled by a light emitting diode 176 is used in each of the limiters 62, 64, 66, 68, 70, 72, 74, and 76.

The first side of the light-dependent resistor 174 is connected to the inverting input of the operational amplifier 168. The second side of the light-dependent resistor 174 is connected to the output of the operational amplifier 168. The non-inverting input of the operational amplifier 168 in connected to ground. The first side of a resistor 178 is connected to the output of the operational amplifier 168. The second side of the resistor 178 is connected to ground.

The resistors 166, 170, and 178, the light-dependent resistor 174, and the operational amplifier 168 together constitute an amplifier. In the preferred embodiment, the resistor 166 has a value of 10K Ohms, the resistor 170 has a value of 33K Ohms, and the resistor 178 has a value of 620 Ohms. In the preferred embodiment, the photoconductive module 172 is a VACTEC VTL 2C2. The amplifier has a gain of +10 dB; accordingly, when a −10 dB signal is supplied to it, the output will be 0 dB.

The output of the operational amplifier 168 of each of the limiters 62, 64, 66, 68, 70, 72, 74, and 76 is connected to a limiter test point 180. The output of the operational amplifier 168 is also the output of each of the limiters 62, 64, 66, 68, 70, 72, 74, and 76. This output is supplied as an input to the active combining network 94 in the first channel accurate reproduction system circuit 22 (FIG. 1).

The first side of a potentiometer 182 is connected to the output of the operational amplifier 168, which functions as a limiter amplifier. The second side of the potentiometer 182 is connected to ground. In the preferred embodiment, the potentiometer 182 is 100K Ohms. The center tap of the potentiometer is connected to the first side of a resistor 184. The second side of the resistor 184 is connected to the inverting input of an operational amplifier 186. The first side of a resistor 188 is connected to the inverting input of the operational amplifier 186. The second side of the resistor 188 is connected to the output of the operational amplifier 186. The non-inverting input of the operational amplifier 186 is connected to ground.

The resistors 184 and 188 and the operational amplifier 186 together constitute an amplifier. In the preferred embodiment, the resistor 184 has a value of 100K Ohms, and the resistor 188 has a value of 240K Ohms. The amplifier has a gain of +8 dB. The output of the operational amplifier 186 is also the indicator output of each of the limiters 62, 64, 66, 68, 70, 72, 74, and 76. This indicator output is supplied as an input to the limiter indicators 78, 80, 82, 84, 86, 88, 90, and 92 of the limiters 62, 64, 66, 68, 70, 72, 74, and 76, respectively, in the first channel accurate reproduction system circuit 22 (FIG. 1).

The cathode of a diode 190 and the anode of a diode 192 are connected together, and to the output of the operational amplifier 186. The anode of a diode 194 and the cathode of a diode 196 are connected together, and to ground. The cathode of the diode 192 and the anode of the diode 196 are connected together, and to the cathode of the light emitting diode 176 of the photoconductive module 172. The anode of the diode 190 and the cathode of the diode 194 are connected together, to the first side of a resistor 198, and to the anode of a diode 200.

The second side of the resistor 198 and the cathode of the diode 200 are connected together, and to the anode of the light emitting diode 176 of the photoconductive module 172. In the preferred embodiment, the resistor 198 has a value of 1K Ohms, and the diodes 190, 192, 194, 196, and 200 are all standard value diodes. This completes the description of components in the limiters 62, 64, 66, 68, 70, 72, 74, and 76.

Referring next to FIG. 5, the electrical schematic of the active combining network 94 used in the first channel accurate reproduction system circuit 22 of FIG. 1 is illustrated. The first side of a resistor 202 is connected to the output of the operational amplifier 168 of the limiter 62 generically illustrated in FIG. 4. The first side of a resistor 204 is connected to the output of the operational amplifier 168 of the limiter 64 generically illustrated in FIG. 4. The first side of a resistor 206 is connected to the output of the operational amplifier 168 of the limiter 66 generically illustrated in FIG. 4. The first side of a resistor 208 is connected to the output of the operational amplifier 168 of the limiter 68 generically illustrated in FIG. 4.

The first side of a resistor 210 is connected to the output of the operational amplifier 168 of the limiter 70 generically illustrated in FIG. 4. The first side of a resistor 212 is connected to the output of the operational amplifier 168 of the limiter 72 generically illustrated in FIG. 4. The first side of a resistor 214 is connected to the output of the operational amplifier 168 of the limiter 74 generically illustrated in FIG. 4. The first side of a resistor 216 is connected to the output of the operational amplifier 168 of the limiter 76 generically illustrated in FIG. 4.

The second sides of the resistors 202, 204, 206, 208, 210, 212, 214, and 216 are connected together, and to the inverting input of an operational amplifier 218. The first side of a resistor 220 is connected to the inverting input of the operational amplifier 218. The second side of the resistor 220 is connected to the output of the operational amplifier 218. The first side of a potentiometer 222 is connected to the output of the operational amplifier 218. The second side of the potentiometer 222 is connected to ground. The non-inverting input of the operational amplifier 218 is connected to ground.

The resistors 202, 204, 206, 208, 210, 212, 214, and 216, the resistor 220, the potentiometer 222, and the operational amplifier 218 together constitute an amplifier. In the preferred embodiment, the resistors 202, 204, 206, 208, 210, 212, 214, and 216 each have a value of 10K Ohms, the resistor 220 has a value of 10K Ohms, and the potentiometer 222 has a value of 1K Ohms. The amplifier has a gain of 0 dB, or a unity gain. The center tap of the potentiometer 222 is connected to an accurate reproduction system test point 224. The output from the center tap of the potentiometer 222 is supplied as an input to the first channel output circuit 24 in the first channel accurate reproduction system circuit 22 (FIG. 1).

Figure 6:
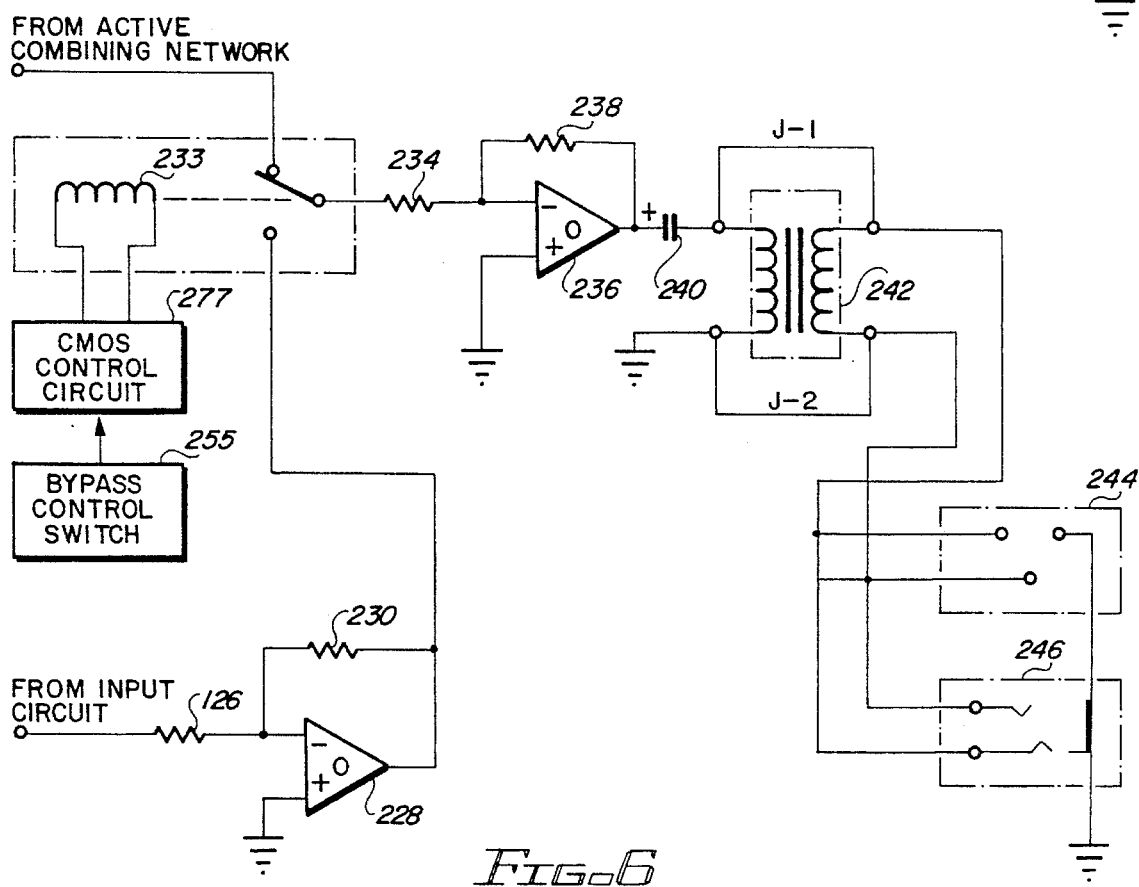
FIG. 6 is an electrical schematic of the first channel output circuit illustrated in FIG. 1, showing the bypass buffer amplifier, the bypass control switch, the CMOS control circuit, the bypass relay, the output amplifier, and the optional transformer used to produce a balanced output, and the jumpers used to produce an unbalanced output.

Referring now to FIG. 6, the electrical schematic of the first channel output circuit 24 of FIG. 1 is illustrated. The first side of a resistor 226 is connected to the output of the operational amplifier 136 of the first channel input circuit 20 illustrated in FIG. 2. The second side of the resistor 226 is connected to the inverting input of an operational amplifier 228. The first side of a resistor 230 is connected to the inverting input of the operational amplifier 228. The second side of the resistor 230 is connected to the output of the operational amplifier 228. The non-inverting input of the operational amplifier 228 is connected to ground.

The resistors 226 and 230 and the operational amplifier 228 together constitute a buffer amplifier. In the preferred embodiment, the resistors 226 and 230 each have a value of 100K Ohms. The buffer amplifier thus has a gain of 0 dB, or a unity gain.

The output of the operational amplifier 228 is connected to a first contact of a single pole, double throw switch 232, which is part of a relay 231. The second contact of the single pole, double throw switch 232 is connected to the center tap of the potentiometer 222 of the active combining network 94 illustrated in FIG. 5. The throw of the single pole, double throw switch 232 is connected to the first side of a resistor 234. The single pole, double throw switch 232 of the relay 231 is driven by a bypass control switch 235, which drives a CMOS control circuit 237 to operate the coil 233.

The bypass control switch 235 is used either to select the output of the first channel accurate reproduction system circuit 22 (FIG. 1), or to bypass the first channel accurate reproduction system circuit 22 and select the output of the first channel input circuit 20. In the preferred embodiment, the relay 231 may be a GORDOS #831C-4, and the CMOS control circuit 237 is a standard generic CMOS circuit.

The second side of the resistor 234 is connected to the inverting input of an operational amplifier 236. The first side of a resistor 238 is connected to the inverting input of the operational amplifier 236. The second side of the resistor 238 is connected to the output of the operational amplifier 236. The non-inverting input of the operational amplifier 236 is connected to ground.

The resistors 234 and 238 and the operational amplifier 236 together constitute the output amplifier 98 of the first channel output circuit 24 (FIG. 1). In the preferred embodiment, the resistors 234 and 238 each have a value of 10K Ohms. The output amplifier 98 thus has a gain of 0 dB, or a unity gain.

The first side of a capacitor 240 is connected to the output of the operational amplifier 236. The second side of the capacitor 240 is connected to the first lead of the primary side of an optional transformer 242 used if a balanced output is desired. The second lead of the primary side of the optional transformer 242 is connected to ground.

Two output connectors are provided in the preferred embodiment of the firs channel output circuit 24: a male XLR connector 244 and a female ¼ inch phone plug 246. The first lead of the secondary side of the optional transformer 242 is connected to a first one of the terminals of the male XLR connector 244 and to the tip terminal of the female ¼ inch phone plug 246. The second lead of the secondary side of the optional transformer 242 is connected to a second one of the terminals of the male XLR connector 244 and to the ring terminal of the female ¼ inch phone plug 246.

A third one of the terminals of the male XLR connector 244 and the sleeve terminal of the female ¼ inch phone plug 246 are each connected to ground. A pair of jumpers J-1 and J-2 are shown where they would be connected when an unbalanced output is desired and the optional transformer 242 is not used. The jumper J-1 connects the second side of the capacitor 240 to the first one of the terminals of the male XLR connector 244 and to the tip terminal of the female ¼ inch phone plug 246. The jumper J-2 connects the second one of the terminals of the male XLR connector 244 and the ring terminal of the female ¼ inch phone plug 246 to ground. The jumpers J-1 and J-2 are used only if an unbalanced output is desired. If a balanced output is desired, the jumpers J-1 and J-2 are removed, and the optional transformer 242 is used.

Referring next to FIG. 7, a generic electrical schematic of the limiter indicators 78, 80, 82, 84, 86, 88, 90, and 92 used to indicate the limiting of the limiters 62, 64, 66, 68, 70, 72, 74, and 76 in the first channel accurate reproduction system circuit 22 of FIG. 1 is illustrated. Each of the limiter indicators 78, 80, 82, 84, 86, 88, 90, and 92 uses this same schematic, with identical component values being used in the limiter indicators 78, 80, 82, 84, 86, 88, 90, and 92. The first side of a resistor 250 is connected to the output of the operational amplifier 186 of the limiters 62, 64, 66, 68, 70, 72, 74, and 76 illustrated in FIG. 4.

Thus, the resistor 250 in the limiter indicator 78 is connected to the output of the operational amplifier 186 in the limiter 62, the resistor 250 in the limiter indicator 80 is connected to the output of the operational amplifier 186 in the limiter 64, the resistor 250 in the limiter indicator 82 is connected to the output of the operational amplifier 186 in the limiter 66, and the resistor 250 in the limiter indicator 84 is connected to the output of the operational amplifier 186 in the limiter 68.

Similarly, the resistor 250 in the limiter indicator 86 is connected to the output of the operational amplifier 186 in the limiter 70, the resistor 250 in the limiter indicator 88 is connected to the output of the operational amplifier 186 in the limiter 72, the resistor 250 in the limiter indicator 90 is connected to the output of the operational amplifier 186 in the limiter 74, and the resistor 250 in the limiter indicator 92 is connected to the output of the operational amplifier 186 in the limiter 76.

The second side of the resistor 250 is connected to the inverting input of an operational amplifier 252. The first side of a resistor 256 is connected to the inverting input of the operational amplifier 252. The second side of the resistor 256 is connected to the output of the operational amplifier 252. The non-inverting input of the operational amplifier 252 is connected to ground.

The first side of a resistor 258 is connected to the output of the operational amplifier 252. The second side of the resistor 258 is connected to the anode of a light emitting diode 260. The cathode of the light emitting diode 260 is connected to ground.

The resistors 250, 256, and 258, the operational amplifier 252, and the diode 260 together constitute one of the limiter indicators 78, 80, 82, 84, 86, 88, 90, and 92. In the preferred embodiment, the resistor 250 has a value of 100K Ohms, the resistor 256 has a value of 240K Ohms, and the resistor 258 has a value of 330 Ohms. The diode 260 is a standard value light emitting diode. The amplifier in each of the limiter indicators 78, 80, 82, 84, 86, 88, 90, and 92 has a gain of +8 dB.

Moving next to FIGS. 8 and 9, an accurate reproduction system 262 embodying the construction illustrated in FIGS. 1 through 7 is shown from the front and the rear, respectively. Several of the components used in FIGS. 1 through 7 appear in FIGS. 8 and 9, with a numerical additive of 1000 used to depict components of the second channel not shown in detail in FIGS. 1 through 7.

As shown in FIG. 8, on the front of the accurate reproduction system 262 is the potentiometer 132 used to control the first channel, and a potentiometer 1132 used to control the second channel. The input bar graph 44 for the first channel and an input bar graph 1044 for the second channel each have ten light emitting diode segments. In the preferred embodiment, the left segments are green and the right segments are red on each of the input bar graphs 44 and 1044. The intermediate segment on each of the input bar graphs 44 and 1044 is yellow. The yellow segment indicated −10 dB and the red segments indicates a higher level, such as for example 0 dB.

Completing the front of the accurate reproduction system 262 is the bypass control switch 235, a bypass control switch 1235 for the second channel, and an on/off power switch 264. The bypass control switches 235 and 1235 each contain an LED which is lit whenever the accurate reproduction system circuitry is in use.

As shown in FIG. 9, extending from the back of the accurate reproduction system 262 is a power cord 266. Located on the back of the accurate reproduction system 262 is a fuse 268. A bypass remote control socket 270, which may be a DB-9 female plug, is located on the back of the accurate reproduction system 262.

The various inputs and outputs are also located on the back of the accurate reproduction system 262. A balanced input may be provided for the first channel through the female XLR connector 102. Similarly, a balanced input may be provided for the second channel through a female XLR connector 1102. An unbalanced input may be provided to the first channel through either the female ¼ inch phone plug 104 or the female RCA plug 106.

A balanced input or an unbalanced input for the first channel may be selected with the input selector switch 108. Similarly, an input selector switch 1108 is used to select a balanced input or an unbalanced input for the second channel. The ground lift switch 107 may be used to prevent hum in the first channel by disconnecting the ground pin of the female XLR connector 102 from the rest of the circuitry in the accurate reproduction system. Similarly, a ground lift switch 1107 may be used to prevent hum in the second channel by disconnecting the ground pin of the female XLR connector 1102.

If the optional transformer 242 is installed in the first channel circuitry, a balanced output will be provided for the first channel from both the male XLR connector 244 and from the female ¼ inch phone plug 246. Similarly, if an optional transformer 1242 (not shown) is installed in the second channel circuitry, a balanced output will be provided for the second channel from both a male XLR connector 1244 and from a female ¼ inch phone plug 1246.

If the optional transformer 242 is not installed in the first channel circuitry, an unbalanced output will be provided for the first channel from both the male XLR connector 244 and from the female ¼ inch phone plug 246. Similarly, if an optional transformer 1242 is not installed in the second channel circuitry, an unbalanced output will be provided for the second channel from both a male XLR connector 1244 and from a female ¼ inch phone plug 1246.

Referring finally to FIG. 10, a bypass remote control 272 is illustrated. The bypass remote control 272 has a bypass remote control plug 274, which may be a DB-9 male plug, which will be received in the bypass remote control socket 270. The bypass remote control plug 274 is connected via a cord 276 to a control head 278. Contained on the control head 278 are a first channel bypass control switch 280, and a second channel bypass control switch 1280. The bypass control switches 280 and 1280 each have an LED on them. Both the bypass control switches 280 and 1280 and the LED's thereon function similarly to the bypass control switches 235 and 1235 and the LED's thereon.

The calibration and the operation of the accurate reproduction system 262 for the first channel may now be described with respect to the figures. The calibration and the operation of the accurate reproduction system 262 for the second channel is identical. Calibration is a one-time procedure using a 20 Hz to 20K Hz pink noise generator (not shown) and an AC voltmeter (also not shown).

The pink noise generator is plugged into the first channel accurate reproduction system circuit 22 shown in FIG. 2. The pink noise input may be balanced (provided to the female XLR connector 102) or unbalanced (provided to either the female ¼ inch phone plug 104 or the female RCA plug 106). The pink noise generator is turned on and set to provide a −10 dB or higher calibration signal (this is to the unbalanced input—if the balanced input is used, the level would be sufficiently high to generate at least a 0 dB signal at the output of the operational amplifier 114).

The AC voltmeter probes are connected to ground and to the input test point 148. The potentiometer 132 is then adjusted to provide a −10 dB signal at the input test point 148. This may also be detected by using the yellow segment of the input bar graph 44 (FIG. 8). During calibration, at this point the level of the calibration signal at all frequencies is −10 dB. This completes the calibration of the first channel input circuit 20.

The calibration signal is next split into the eight frequency bands by the filters 46, 48, 50, 52, 54, 56, 58, and 60 (FIG. 1). During calibration, the level of the calibration signals at the outputs of each of the filters 46, 48, 50, 52, 54, 56, 58, and 60 is −10 dB. Each of the eight filter/limiter combinations must be calibrated individually. In this example, the 45 Hz bandpass filter 46 and the limiter 62 (using the limiter indicator 78) will be calibrated first.

As stated above, during calibration the level of the calibration signals at the outputs of each of the 45 Hz bandpass filter 46 should be −10 dB. This may be verified by connecting the AC voltmeter probes to ground and to the filter test point 164 of the 45 Hz bandpass filter 46. The calibration signal frequency band is supplied by the 45 Hz bandpass filter 46 to the limiter 62.

The AC voltmeter probes are next connected to ground and to the limiter test point 180 of the limiter 62. Since the limiter 62 has 10 dB of gain, the level of the calibration signal at the limiter test point 180 of the limiter 62 should be 0 dB. The potentiometer 182 of the limiter 62 is adjusted so that the level of the calibration signal at the limiter test point 180 of the limiter 62 just begins to drop below 0 dB. This may also be detected by monitoring the light emitting diode 260 of the limiter indicator 78. At the proper setting of the potentiometer 182, the light emitting diode 260 of the limiter indicator 78 will light.

This completes the calibration of the 45 Hz components (the 45 Hz bandpass filter 46 and the limiter 62 using the limiter indicator 78). The other seven frequency bands must now be calibrated in the same manner. Following calibration of all of the other frequency bands in this same manner, the active combining network 94 must be calibrated.

This is done by connecting the probes of the AC voltmeter to ground and to the accurate reproduction system test point 224. (Note that if any of the frequency band adjustments required the adjustment of the potentiometer 132 in the first channel input circuit 20, it must be readjusted to produce a −10 dB output at the input test point 148 before calibrating the active combining network 94.) The level of the calibration signal at the accurate reproduction system test point 224 should be −10 dB. The potentiometer 222 of the active combining network 94 is adjusted so that the level of the calibration signal at the accurate reproduction system test point 224 is −10 dB. This completes the calibration of the apparatus in the first channel accurate reproduction system circuit 22, and in the first channel of the accurate reproduction system 262 itself. The second channel must also be calibrated in the manner described above.

As the device is used, the limiters in the various frequency bands will prevent the level of any frequency from rising above the overall level of the entire audio signal. As the level of the signal in a particular frequency band tries to rise above the level of 0 dB in the limiter for that frequency band, the resistance of the resistor in the photoconductive module in the limiter will drop to lower the overall gain of that limiter, thus effectively limiting the signal in that particular frequency band. The limiter disclosed herein has a 10:1 limiting ratio. By adjusting the potentiometer 132 in the first channel input circuit 20, the amount of correction applied can be increased or decreased to enhance poor recordings or recordings from poor media, or a poor live feed.

It may therefore be appreciated from the above detailed description of the preferred embodiment of the present invention that it teaches an accurate reproduction system and a related methodology for operating the system which compensate for the wide variations in frequency response in any audio signal in recorded or live music. The system of the present invention and the methodology for operating the system of the present invention also provide such compensation on a dynamic basis, automatically correcting frequency response irregularities as the audio signal is being reproduced. As such, the system of the present invention and the methodology for operating the system of the present invention provide accurate dynamic compensation without the necessity for the user making frequent or complicated adjustments.

Further, the accurate reproduction system of the present invention and the related methodology for operating the system of the present invention provide for a significant degree of adjustment to compensate for sources which have a greater or lesser inaccuracy in their frequency response. This adjustment to compensate for variations in the frequency response is quite easy for the user to accomplish. In addition, manual adjustment of the degree of correction to flatten overall frequency response is facilitated by providing an indicator of the degree of adjustment made by the user which is visible as the adjustment is being made.

The accurate reproduction system of the present invention is also of a design which is both durable and long lasting, and it requires little or no calibration or other maintenance to be provided by the user. The accurate reproduction system of the present invention is also of inexpensive construction in order to enhance its market appeal, and to thereby afford it the broadest possible market. Finally, all of the aforesaid advantages and objectives of the accurate reproduction system of the present invention and the related methodology for operating the system of the present invention are achieved without incurring any substantial relative disadvantage.

Although an exemplary embodiment of the present invention has been shown and described, it will be apparent to those having ordinary skill in the art that a number of changes, modifications, or alterations to the invention as described herein may be made, none of which depart from the spirit of the present invention. All such changes, modifications, and alterations should therefore be seen as within the scope of the present invention.

What is claimed is:

1. An electronic audio processing system for insertion intermediate an audio source and an audio amplifier, said electronic audio processing system comprising:

input means for receiving an audio input signal from an audio source, said audio input signal comprising a full frequency range input signal;

means for dividing said full frequency range input signal into a plurality of separate frequency band signals;

a plurality of gain control amplifiers, each of said plurality of gain control amplifiers receiving as an input one of said plurality of separate frequency band signals, each of said gain control amplifiers comprising:

a variable gain amplifier for providing a variable degree of amplification between a minimum gain and a maximum gain to one of said plurality of separate frequency band signals, each of said variable gain amplifiers supplying as an output one of a plurality of gain controlled separate frequency band signals; and means for dynamically varying the degree of amplification of said variable gain amplifier such that input signal levels below a lower reference level are amplified by a constant gain, and input signal levels above said lower reference level are amplified to an output level substantially equal to but not exceeding a predetermined level higher than said lower reference level; and means for combining said plurality of gain controlled separate frequency band signals into a single full frequency range output signal.

2. An electronic audio processing system as defined in claim 1, wherein said input means comprises:

means for receiving a balanced audio input signal;

means for receiving an unbalanced audio input signal; and switch means for alternatively selecting either an output from said means for receiving a balanced audio input signal or an output from said means for receiving an unbalanced audio input signal.

3. An electronic audio processing system as defined in claim 2, wherein said means for receiving a balanced audio input signal comprises:

connector means for receiving a balanced audio input signal; and a first input amplifier connected to said connector means for receiving a balanced audio input signal, said first input amplifier for amplifying said balanced audio input signal; and wherein said means for receiving an unbalanced audio input signal comprises:

connector means for receiving an unbalanced audio input signal; and a second input amplifier connected to said connector means for receiving an unbalanced audio input signal, said second input amplifier for amplifying said unbalanced audio input signal.

4. An electronic audio processing system as defined in claim 3, wherein said connector means for receiving a balanced audio input signal comprises:

a female XLR connector; and wherein said connector means for receiving an unbalanced audio input signal comprises:

a female ¼ inch phone jack.

5. An electronic audio processing system as defined in claim 1, wherein said input means comprises:

an input attenuator for adjusting the level of said full frequency range input signal to a selected level.

6. An electronic audio processing system as defined in claim 5, wherein said input means additionally comprises:

means for visually indicating the level of said full frequency range input signal as adjusted by said input attenuator.

7. An electronic audio processing system as defined in claim 1, wherein said dividing means comprises:

a plurality of filters.

8. An electronic audio processing system as defined in claim 7, wherein there are a total of between five and twenty-seven filters.

9. An electronic audio processing system as defined in claim 8, where there are a total of eight filters.

10. An electronic audio processing system as defined in claim 7, wherein said plurality of filters comprises:

a plurality of bandpass filters; and a high pass filter.

11. An electronic audio processing system as defined in claim 1, wherein said minimum gain is approximately 1 dB and wherein said maximum gain is approximately 10 dB.

12. An electronic audio processing system as defined in claim 1, wherein the degree of amplification of said variable gain amplifier is determined by a resistor, wherein each of said gain control amplifiers additionally comprises:

a photoconductive module having a light emitting diode producing a level of light directly proportional to the amplified level of said one of said plurality of separate frequency band signals, said photoconductive module also comprising said resistor, said resistor having a resistance inversely proportional to the level of light produced by said light emitting diode, a lower value of said resistor producing a lower value of amplification of said variable gain amplifier.

13. An electronic audio processing system as defined in claim 1, wherein said maximum gain of said variable gain amplifier is selected to continuously maintain the level of said one of said plurality of separate frequency band signals as close to the level of said full frequency range input signal as possible without exceeding said full frequency range input signal.

14. An electronic audio processing system as defined in claim 1, wherein each of said gain control amplifiers additionally comprises:

means for calibrating said means for dynamically varying the degree of amplification of said variable gain amplifier, said calibrating means comprising a light emitting diode which lights when said means for dynamically varying the degree of amplification is properly calibrated.

15. An electronic audio processing system as defined in claim 1, additionally comprising:

means for increasing the level of said full frequency range input signal supplied from said input means to said dividing means.

16. An electronic audio processing system as defined in claim 1, wherein said means for combining comprises an attenuator for adjusting the level of said single full frequency range output signal to approximately the same level as said full frequency range input signal, and in no event less than that level.

17. An electronic audio processing system as defined in claim 1, additionally comprising:

means for providing an audio output signal from said electronic audio processing system, including a switch for selecting either said full frequency range input signal or said single full frequency range output signal as said audio output signal; and at least one of:

means for supplying said audio output signal as a balanced audio output signal; and means for supplying said audio output signal as an unbalanced audio output signal.

18. An electronic audio processing system as defined in claim 17, wherein said means for supplying said audio output signal as a balanced audio output signal comprises:

a transformer having its primary connected to said switch, said balanced audio output signal being supplied from the secondary of said transformer.

19. An electronic audio processing system as defined in claim 17, wherein said means for supplying said audio output signal as a balanced audio output signal and said means for supplying said audio output signal as an unbalanced audio output signal each comprise:
- a male XLR connector; and
- a female ¼ inch phone jack.

20. An electronic audio processing system for insertion intermediate an audio source and an audio amplifier, said electronic audio processing system comprising:

input means for receiving an audio input signal from an audio source, said audio input signal comprising a full frequency range input signal, said input means including an input attenuator for adjusting the level of said full frequency range input signal to a first predetermined level;

filter means for dividing said full frequency range input signal into a plurality of separate frequency band signals;

a plurality of gain control amplifiers, each of said plurality of gain control amplifiers receiving as an input one of said plurality of separate frequency band signals, each of said gain control amplifiers comprising:

a variable gain amplifier for providing a variable degree of amplification between a minimum gain and a maximum gain to one of said plurality of separate frequency band signals, each of said variable gain amplifiers supplying as an output one of a plurality of gain controlled separate frequency band signals; and means for dynamically varying the degree of amplification of said variable gain amplifier such that input signal levels below a lower reference level are amplified by a constant gain, and unput signal levels above said lower reference level are amplified to an output level substantially equal to but not exceeding a second predetermined level higher than said lower reference level, said second predetermined level being related to said first predetermined level; and means for combining said plurality of gain controlled separate frequency band signals into a single full frequency range output signal.

21. An electronic audio processing system for insertion intermediate an audio source and an audio amplifier, said electronic audio processing system comprising:

means for dividing a full frequency range input signal received from an audio source into a plurality of separate frequency band signals;

a plurality of gain control amplifiers each receiving as an input one of said plurality of separate frequency band signals, each of said gain control amplifiers comprising:

a variable gain amplifier for providing a variable degree of amplification between a minimum gain and a maximum gain to one of said plurality of separate frequency band signals, each of said variable gain amplifiers supplying as an output one of a plurality of gain controlled separate frequency band signals; and means for dynamically varying the degree of amplification of said variable gain amplifier such that input signal levels below a lower reference level are amplified by a constant gain, and input signal levels above said lower reference level are amplified to an output level substantially equal to but not exceeding a predetermined level higher than said lower reference level; and means for combining said plurality of gain controlled separate frequency band signals into a single output signal.

22. A method of electronically processing an audio signal from an audio source, said method comprising:

receiving an audio input signal from an audio source, said audio input signal comprising a full frequency range input signal;

dividing said full frequency range input signal into a plurality of separate frequency band signals;

receiving as an input to each of a plurality of gain control amplifiers one of said plurality of separate frequency band signals;

in each gain control amplifier, providing a variable degree of amplification between a minimum gain and a maximum gain to one of said plurality of separate frequency band signals, and supplying as an output from each gain control amplifier one of a plurality of gain controlled separate frequency band signals;

dynamically varying the degree of amplification in each gain control amplifier such that input signal levels below a lower reference level are amplified by a constant gain, and input signal levels above said lower reference level are amplified to an output level substantially equal to but not exceeding a predetermined level higher than said lower reference level; and combining said plurality of gain controlled separate frequency band signals into a single full frequency range output signal.

* * * * *